(12) United States Patent
Yang et al.

(10) Patent No.: US 8,277,667 B2
(45) Date of Patent: Oct. 2, 2012

(54) MAGNETIC ELEMENT AND MANUFACTURING METHOD THEREFOR

(75) Inventors: Hsueh-An Yang, Hsinchu (TW);
Weileun Fang, Hsinchu (TW);
Tsung-Lin Tang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 1156 days.

(21) Appl. No.: 12/013,843

(22) Filed: Jan. 14, 2008

(65) Prior Publication Data
US 2009/0047527 A1 Feb. 19, 2009

(30) Foreign Application Priority Data
Aug. 15, 2007 (TW) ............................. 96130242 A

(51) Int. Cl.
*H01L 21/302* (2006.01)
*B81C 1/00* (2006.01)

(52) U.S. Cl. .................. 216/2; 216/22; 216/24; 216/49; 216/67; 205/122; 438/29; 438/719; 438/928

(58) Field of Classification Search .................. None
See application file for complete search history.

(56) References Cited

U.S. PATENT DOCUMENTS

| | | | |
|---|---|---|---|
| 3,261,944 A | 7/1966 | Sherwood | |
| 4,585,282 A | 4/1986 | Bosley | |
| 4,991,836 A | 2/1991 | Joffe | |
| 5,155,651 A | 10/1992 | Yoda et al. | |
| 5,543,956 A | 8/1996 | Nakagawa et al. | |
| 5,912,608 A | 6/1999 | Asada | |
| 6,122,089 A | 9/2000 | Minamoto et al. | |
| 6,295,154 B1 | 9/2001 | Laor et al. | |
| 6,633,158 B1 | 10/2003 | Shen et al. | |
| 6,704,132 B2 * | 3/2004 | Dewa ............................ | 359/290 |
| 6,765,706 B2 | 7/2004 | Tokuda et al. | |

(Continued)

FOREIGN PATENT DOCUMENTS

JP 09129944 A * 5/1997

OTHER PUBLICATIONS

Hsueh-An Yang and Weileun Fang "A Novel Coil-Less Lorentz Force 2D Scanning Mirror Using Eddy Current", 19th IEEE International Conference on Micro Electro Mechanical Systems, pp. 774-777, Jan. 22-26, Istanbul, Turkey, 2006.

*Primary Examiner* — Anita Alanko
(74) *Attorney, Agent, or Firm* — Volpe and Koenig P.C.

(57) ABSTRACT

A magnetic element and its manufacturing method are provided. A magnetic element includes an actuation part having a first surface and a second surface, a torsion bar connected to the actuation part, and a frame connected to the first torsion bar, wherein the first surface of the actuation part is an uneven surface. The manufacturing method of the magnetic element starts with forming an passivation layer on a substrate and defining a special area by the mask method, then continues with forming the adhesion layer and electroplate-initializing layer on the substrate sequentially. The photoresist layer are formed and the magnetic-inductive material is electroformed on the electroplate area. Finally, the substrate is etched and the passivation layer is removed to obtain the magnetic element. The manufacturing method of magnetic element of the present invention can be applied in the microelectromechanical system field and other categories.

5 Claims, 8 Drawing Sheets

U.S. PATENT DOCUMENTS

| | | |
|---|---|---|
| 6,787,047 B1 * | 9/2004 | Hahn et al. ................ 216/2 |
| 6,949,996 B2 | 9/2005 | Matsumoto et al. |
| 7,064,876 B2 | 6/2006 | Cannon et al. |
| 7,109,834 B2 | 9/2006 | Matsumoto |
| 7,116,192 B2 | 10/2006 | Ishizuya et al. |
| 7,247,247 B2 * | 7/2007 | Hsieh et al. ................ 216/2 |
| 7,459,093 B1 * | 12/2008 | Fu ................................ 216/2 |
| 7,538,927 B1 * | 5/2009 | Fu ........................... 359/223.1 |
| 7,641,806 B2 * | 1/2010 | Okumura et al. ............ 216/2 |
| 2002/0121951 A1 | 9/2002 | Shen et al. |
| 2003/0001704 A1 | 1/2003 | Shen et al. |
| 2003/0132822 A1 | 7/2003 | Ko et al. |
| 2003/0210481 A1 * | 11/2003 | Sniegowski et al. ........ 359/846 |
| 2004/0075522 A1 * | 4/2004 | Kato et al. ................ 336/200 |
| 2004/0105139 A1 * | 6/2004 | Hirose et al. .............. 359/226 |
| 2004/0232110 A1 * | 11/2004 | Hsieh et al. ................ 216/58 |
| 2005/0083156 A1 | 4/2005 | Shen et al. |
| 2006/0044094 A1 | 3/2006 | Davis et al. |
| 2007/0210886 A1 | 9/2007 | Gerber |
| 2008/0001690 A1 | 1/2008 | Yang et al. |
| 2008/0197951 A1 | 8/2008 | Yang et al. |
| 2009/0160279 A1 | 6/2009 | Baur |

* cited by examiner

MAGNETIC ELEMENT AND MANUFACTURING METHOD THEREFOR

FIELD OF THE INVENTION

The present invention relates to a magnetic element and a manufacturing method therefor. In particular, the present invention relates to the magnetic element driven by the magnetic force (including Lorentz force and the magnetostatic force) and the manufacturing method therefor.

BACKGROUND OF THE INVENTION

The micro-scanning mirror was first published in 1980, since then the micro-scanning mirror has become a considerably important research issue in the micro-opto-electromechanical system (MOEMS). The micro-scanning mirror is mainly applied in scanners, bar code scanners, laser printers, and projection display systems, etc.

Cathode ray tube televisions in the early stage are all belonged to the sequential scanning system. The operation principle is that the deflection direction of the electronic beam is controlled by the magnetic field under the vacuum environment. The electronic beam is radiated to the back side of the fluorescent screen, and the fluorescent powder is excited on the fluorescent screen so as to radiate the light. After the microelectromechanical system technology is developed, scanning mirrors by means of the light source projection are then developed continuously. The manufacturing methods of the scanning mirrors include the body-typed micro-manufacturing technology and face-typed micro-manufacturing technology.

There are many driving methods for the micro-scanning mirrors, and the electrostatic actuation and the thermal actuation the common ones, etc. However, due to the limited size, the micro-mirror actuated by the magnetism is generally ignored.

In fact, when the current direction is perpendicular to the magnetic field direction, Lorentz force appears. The micro-mirror can be controlled by Lorentz force.

Please refer to FIG. 1, which is a structural diagram showing a micro-mirror according to the prior art. In FIG. 1, the micro-mirror 1 manufactured from the silicon substrate in the etching technology can be layoutted with the copper conductor 3 by the micro-electroforming process. Then, two magnets (not shown in FIG. 1) are fabricated for providing the permanent magnetic field. When the current flows from the torsion bar 2 to the micro-mirror 1, Lorentz force can be generated by the interaction between the current and the magnetic field direction (MFD). Due to the current flowing through the torsion bar 2, the direction thereof is rotated. Therefore, the direction of the generated Lorentz force is also changed, which generates a torque to the micro-mirror 1. When the input signal is an alternating current, the micro-mirror will swing at a high speed. Since the driving source is the current, in order to decrease Joule heat generated on the conductor, the conductor must be plated thicker by means of the electroforming method so as to decrease the resistance of the conductor. In addition, due to the limitation in using the surface micromachining, the conductor cannot be produced as the cubic coil form. The conductor is usually laid out by the spiral method and the conductor is pulled out by the cubic crossing method, i.e. linked through the jumper 4.

However, two drawbacks exist in the traditional micro-mirror which utilizes Lorentz force. One is to produce the coil layout, which needs to spend the layout cost. The other is to avoid Joule heat generated when the large current flows through the coil. In addition, the two drawbacks can be cross-influenced. In order to avoid the generation of Joule heat, it is essential to increase the thickness of the conductor by the electroplating method. However, if the thickness of the layout is not enough, the conductor will be burned down by Joule heat when the current is too large. In order to correct the drawback of the prior art, the applicant of the present invention have applied the Taiwan Patent Application No. 095124215 on Jul. 3, 2006 (corresponding to the U.S. patent application Ser. No. 11/650,402 on Jan. 5, 2007 now published as U.S. Patent Application Publication No. 2008/0001680 A1) and the Taiwan Patent Application No. 096106288 on Feb. 16, 2007 (corresponding to the U.S. patent application Ser. No. 11/842,304 on Aug. 21, 2007 now published as U.S. Patent Application Publication No. 2008/0197951 A1). In these two patent applications, the magnetic element can be driven by Lorentz force and the magnetostatic force. In particular, the direction of the magnetostatic force is determined by controlling the strengths and/or relative locations and/or the magnetic-pole distribution of a plurality of magnetic field generating devices so as to determine the rotating status of the magnetic element. However, besides the abovementioned patent applications, it is therefore attempted by the applicant to deal with another magnetic element driven by applying Lorentz force and the manufacturing method therefor.

SUMMARY OF THE INVENTION

In accordance with one aspect of the present invention, a method for manufacturing a magnetic element is provided. The method includes steps of: (a) providing a substrate having a first surface and a second surface; (b) forming a passivation layer on the first surface; (c) forming an electroplate-initializing layer on the second surface; (d) forming a first photoresist layer having a specific area on the electroplate-initializing layer; (e) forming a magnetic-inductive material on the specific area; (f) forming a second photoresist layer on the first surface of the substrate and on the passivation layer; (g) removing the first photoresist layer, the second photoresist layer, and a part of the electroplate-initializing layer; (h) etching the substrate; and (i) removing the passivation layer for forming the magnetic element.

Preferably, the step (c) further includes steps of: (c1) forming an adhesion layer on the second surface; and (c2) forming the electroplate-initializing layer on the adhesion layer.

Preferably, the step (c) is processed by a deposition method.

Preferably, the step (e) is processed by an electroforming method.

Preferably, the step (g) is processed by an etching method.

In accordance with another aspect of the present invention, a magnetic element is provided. The magnetic element includes: a substrate having a first surface and a second surface; an adhesion layer disposed on the second surface of the substrate; an electroplate-initializing layer disposed on the adhesion layer; and a magnetic-inductive material layer disposed on the electroplate-initializing layer, wherein the first surface of the substrate is an uneven surface.

Preferably, the substrate is a silicon substrate.
Preferably, the adhesion layer is a metal layer.
Preferably, the metal layer includes a gold and a titanium.
Preferably, the electroplate-initializing layer is a metal layer.
Preferably, the magnetic-inductive material layer is a nickel layer.

In accordance with another aspect of the present invention, a magnetic element is provided. The magnetic element includes: an actuation part having a first surface and a second surface; a torsion bar connected to the actuation part; and a frame connected to the first torsion bar, wherein the first surface of the actuation part is an uneven surface.

Preferably, the magnetic element further includes a second torsion bar connected to the actuation part, wherein the second torsion bar has an extended direction which is not parallel to what the torsion bar has.

Preferably, the actuation part includes a silicon substrate and a magnetic-inductive material layer.

Preferably, the first surface of the actuation part has a reinforced structure.

Preferably, the magnetic element is a microelectromechanical system element.

The above objects and advantages of the present invention will become more readily apparent to those ordinarily skilled in the art after reviewing the following detailed descriptions and accompanying drawings, in which:

BRIEF DESCRIPTION OF THE DRAWINGS

FIG. 4(A) to FIG. 4(J) are the flowchart diagrams sequentially showing the manufacturing process of the magnetic element in accordance with the preferred embodiment of the present invention, wherein FIG. 4(A) depicts a passivation layer deposited on first surface of the substrate, FIG. 4(B) depicts that the passivation layer is patterned by the mask method, FIG. 4(C) depicts an adhesion layer and an electroplate-initiating layer sequentially deposited on the second surface of the substrate, FIG. 4(D) depicts a magnetic-inductive material electroformed on the electroplate area defined by the first photoresist layer, FIG. 4(E) depicts electroformation is made on the second surface thereof, FIG. 4(F) depicts the second photoresist layer is identified by the mask method, FIG. 4(G) depicts etching made on the first surface, FIG. 4(H) depicts that the first photoresist layer, the electroplate-initializing layer and the adhesion layer are removed from the second surface and the second photoresist layer is removed from the first surface, FIG. 4(I) depicts that the substrate, which is not protected by the passivation layer, is removed; and FIG. 4(J) depicts that the passivation layer is removed.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
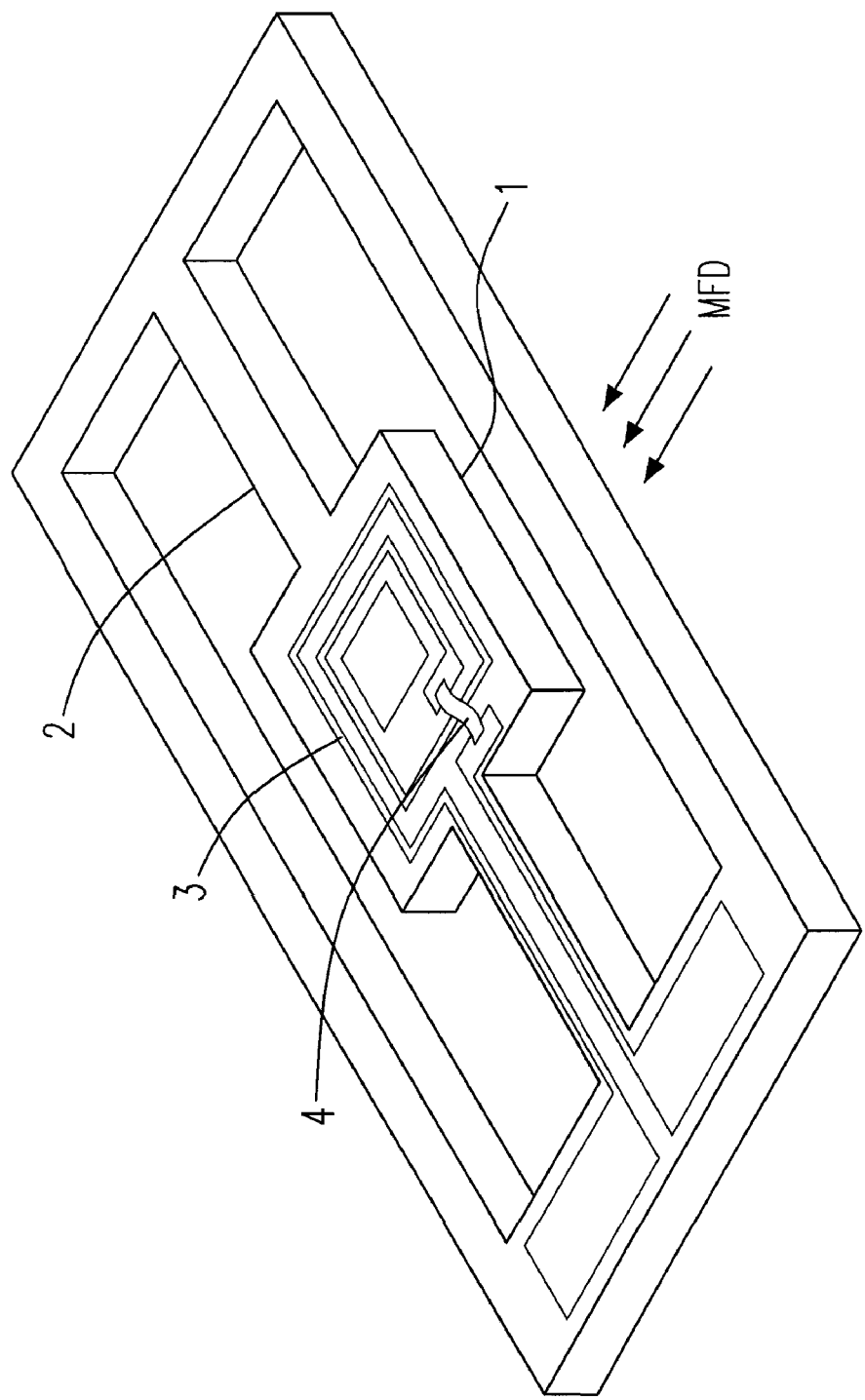
FIG. 1 is a structural diagram showing a micro-mirror according to the prior art.
Figure 2:
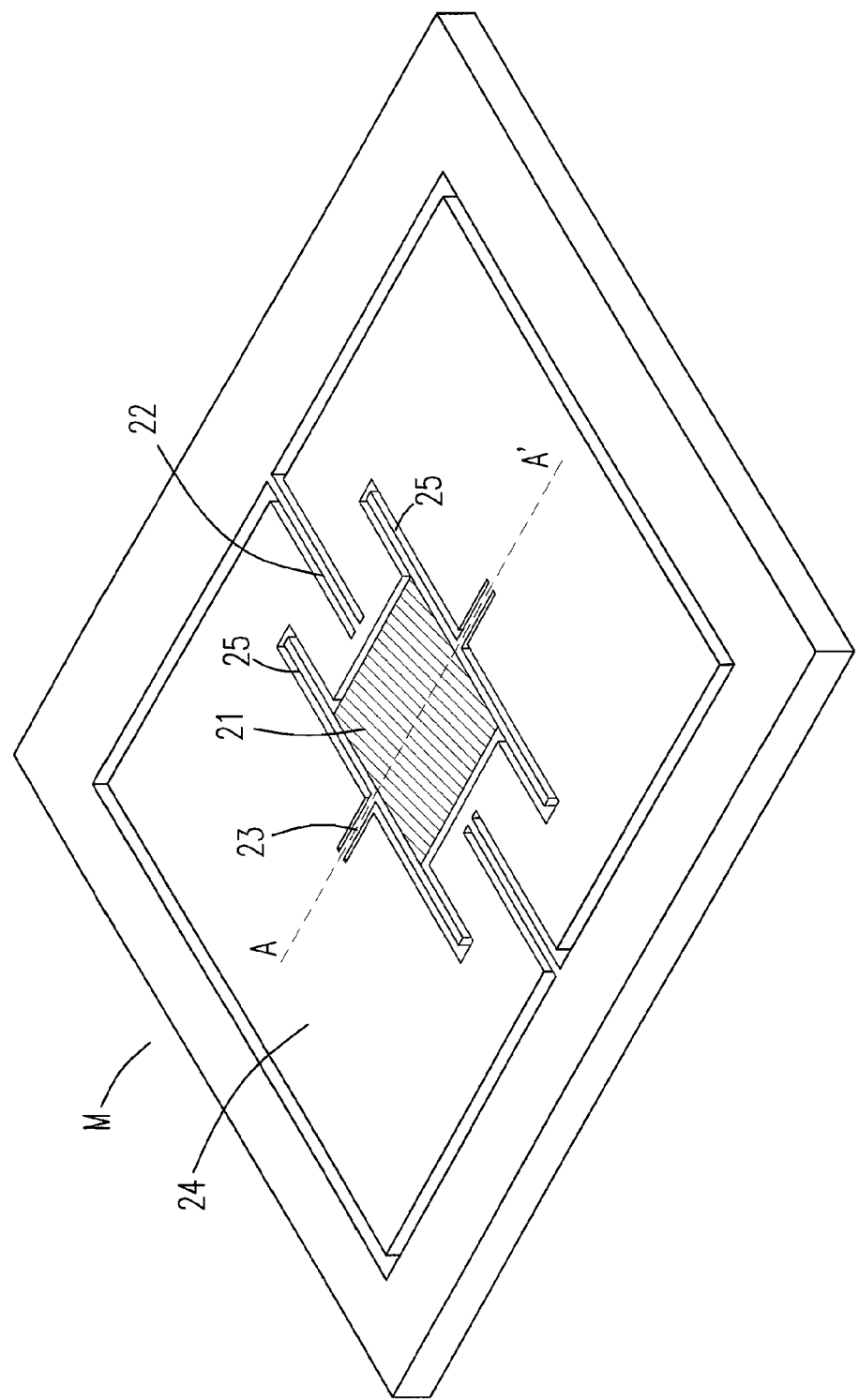
FIG. 2 is a structural diagram showing a magnetic element M in accordance with the preferred embodiment of the present invention.

Please refer to FIG. 2, which is a structural diagram showing a magnetic element M in accordance with the preferred embodiment of the present invention. In FIG. 2, the magnetic element M of the present invention (i.e. micro-scanning mirror) includes an actuation part 21, a first torsion bar 22, a second torsion bar 23, and a frame 24. It is to be noted that the design types and the sizes of the first torsion bar 22 and the second torsion bar 23 can be adjusted in demand. When the length of the first torsion bar 22 and the length of the second torsion bar 23 are not identical, or the shape of the actuation part 21 is not a square, the vibrating range and the resonating frequency of the actuation part 21 will be changed. In addition, the A-A' is the section line for the latter description. The frame 24 is connected to the actuation part 21 through the first torsion bar 22 and the second torsion bar 23. The magnetic-inductive material can be deposited on the frame 24 for achieving the double axes (the first torsion bar 22 and the second torsion bar 23) of scan. Although there are the first torsion bar 22 and the second torsion bar 23 in this embodiment, in fact, the magnetic element of the present invention can also be the single torsion element by controlling the manufacturing process of the magnetic element. For instance, the first torsion bar 22 is not produced, and the actuation part 21 is connected to the frame 24 merely by the second torsion bar 23. In addition, the magnetic-inductive material can also be deposited on the arms 25 of the actuation part 21 for providing the larger arms of the actuation bar 21, so as to drive the magnetic element effectively by the magnetostatic force.

Figure 3:
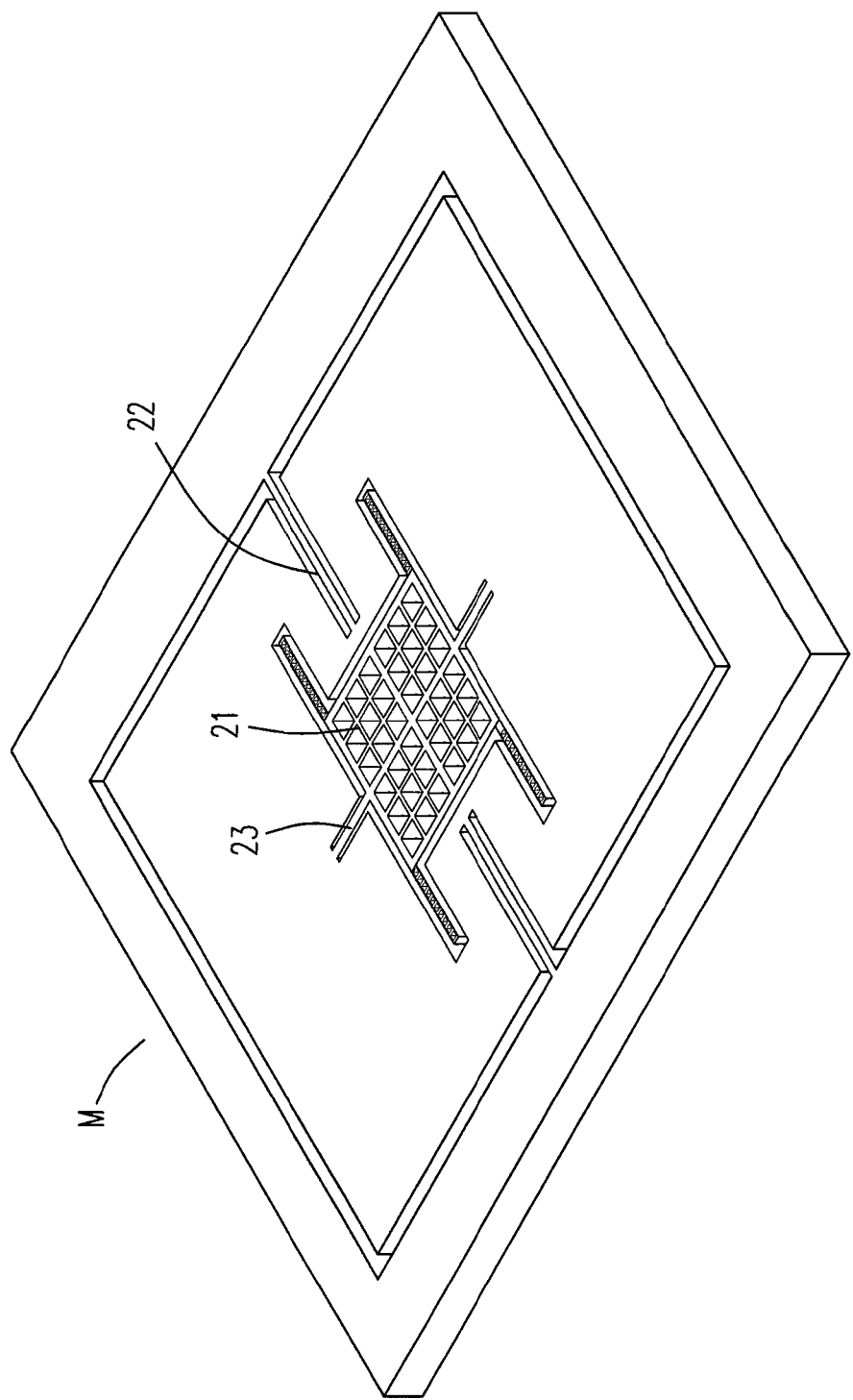
FIG. 3 is a structural diagram showing the reverse side of the magnetic element M in FIG. 2 in accordance with the preferred embodiment of the present invention.

Please refer to FIG. 3, which is a structural diagram showing the reverse side of the magnetic element M in FIG. 2 in accordance with the preferred embodiment of the present invention. In FIG. 3, the reverse side of the actuation part 21 of the present invention is a structure having unequal thickness. The reverse side of the actuation part 21 in this embodiment is shown as the reinforced structure. It should be noted that the vibrating range and the resonating frequency will be directly related to the rigidity and the mass of the actuation part 21. Therefore, if the mass of the actuation part 21 is decreased adequately and does not make too much influence on the rigidity of the actuation part 21, the vibrating range and the resonating frequency of the actuation part 21 will be increased and the constant rigidity of the actuation part 21 will be maintained. Then the generated dynamic deformation is avoided and the utility value of the magnetic element M is increased. In addition, although the lattice-shaped reinforced structure is the instance in the embodiment, in fact, as long as the different positions of the substrate of the actuation part 21 appear the structure with different thicknesses (i.e. it can be round-shaped lattice, star-shaped lattice, and other shape), the mass moment of inertia will be decreased and the torsional resonance frequency will be increased, and there will be no influence on the torsional rigidity of the structure itself. In addition, although the reinforced structure of this embodiment is configured on the reverse side of the magnetic element, the reinforced structure can be configured on both sides thereof in demand.

In order to reduce the mass and to maintain the stiffness of the actuation part 21 simultaneously, an actuation part structure having unequal thickness on one side is provided in the present invention. The manufacturing method is described in FIG. 4(A) to FIG. 4(J), wherein the manufacturing process in FIG. 4 is described according to the area where the A-A' section line is crossed.

Figure 4A:
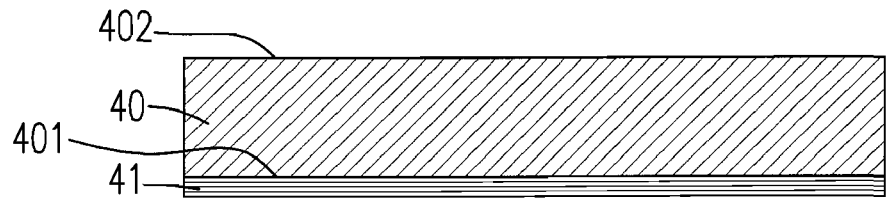
Figure 4B:
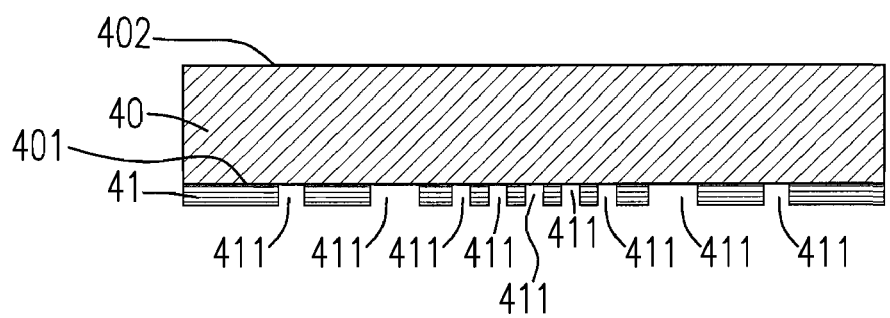
Figure 4C:
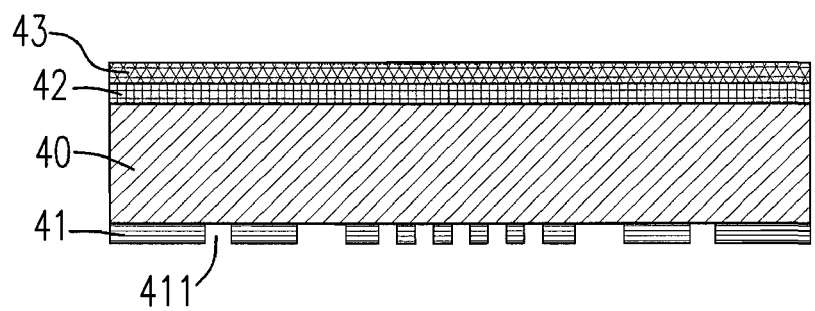
Figure 4D:
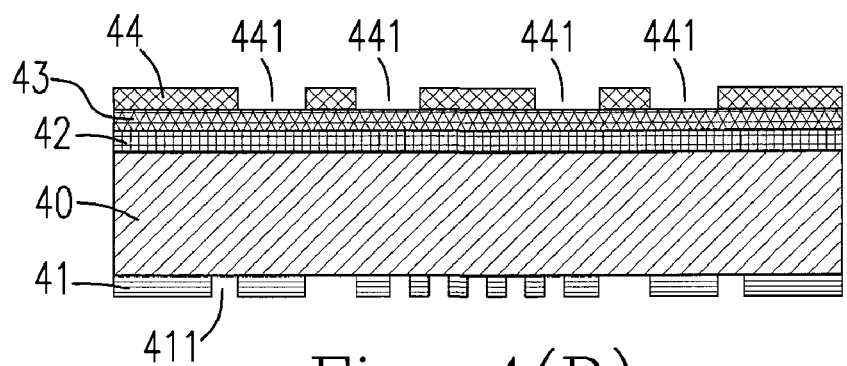
Figure 4E:
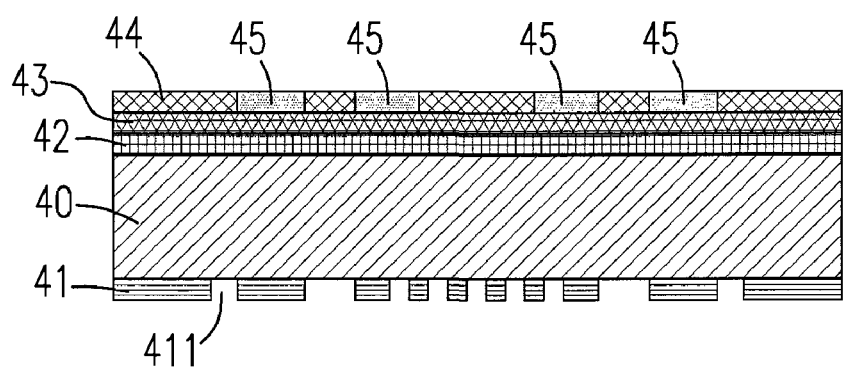
Figure 4F:
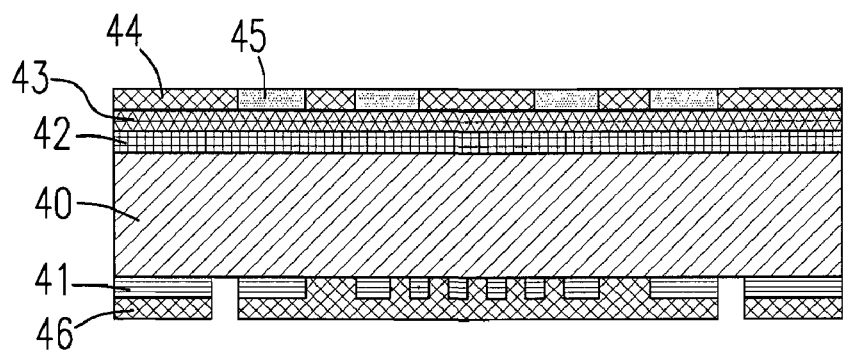
Figure 4G:
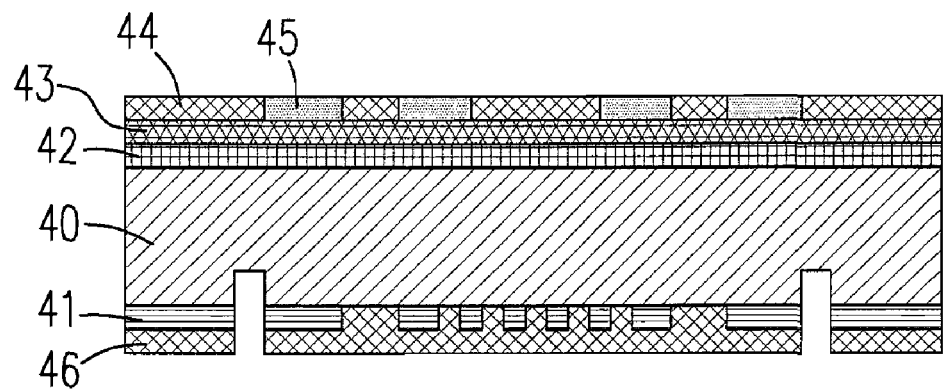
Figure 4H:
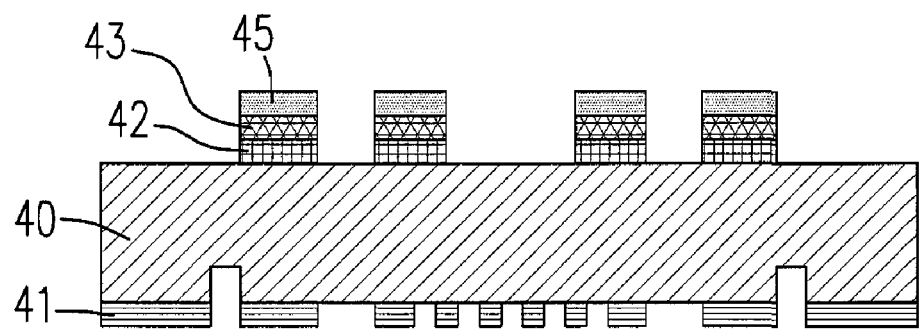
Figure 4I:
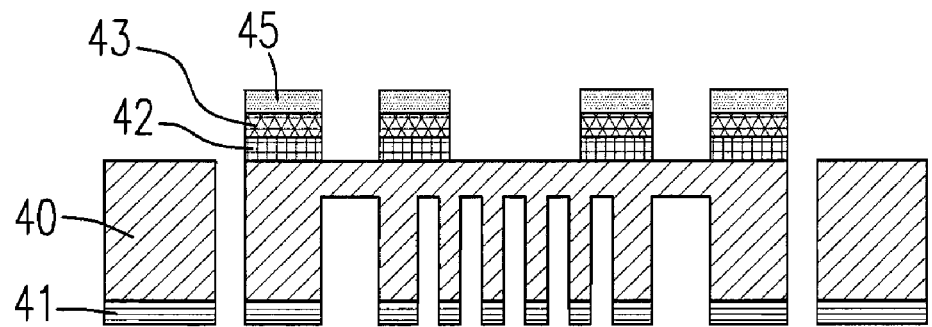
Figure 4J:
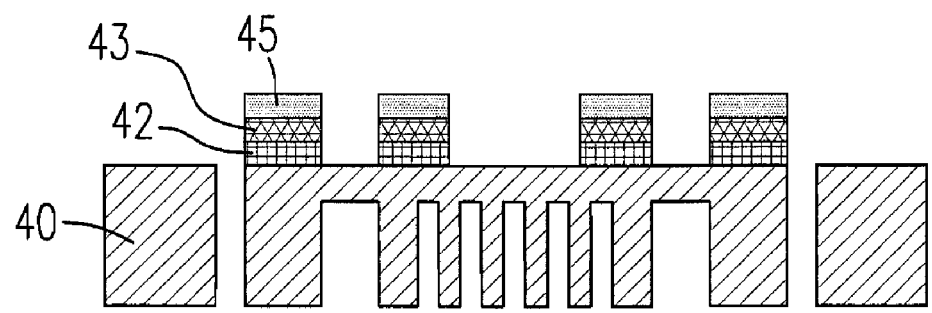

Please refer to FIG. 4(A) to FIG. 4(J), which are the flowchart diagrams showing the manufacturing process of the magnetic element in accordance with the preferred embodiment of the present invention. As shown in FIG. 4(A), first, an passivation layer 41 is deposited on the first surface 401 of the substrate 40. The silicon chip is the material of the substrate 40, and the oxide layer (silicon dioxide) is the passivation layer 41 in this embodiment. Then, the area 411 in demand is defined on the passivation layer 41 by the mask method, and the result is shown in FIG. 4(B). Then, an adhesion layer 42 and an electroplate-initializing layer 43 are deposited on the second surface 402 of the substrate 40. The result is shown in FIG. 4(C), wherein the titanium metal is the adhesion layer 42, and the gold is the electroplate-initializing layer 43 in this embodiment. Then, a first photoresist layer 44 is formed on the electroplate-initializing layer 43 by the deposit method and the mask method, wherein the electroplate area 441 is identified on the electroplate-initializing layer 43 based on the first photoresist layer 44. The result is shown in FIG. 4(D). Then the magnetic-inductive material 45 is electroformed on the electroplate area 441 identified by the first photoresist layer 44. The nickel metal is the magnetic-inductive material 45 in this embodiment, and the result after the electroformation is shown in FIG. 4(E). Then, the second photoresist layer 46 having the reinforced structure is identified by the mask method, and the result is shown in FIG. 4(F). Then, the substrate 40 is etched by the un-protected area of the second photoresist layer 46, and the result is shown in FIG. 4(G). The etching of the substrate 40 is processed by the dry etching method in this embodiment. Then, the first photoresist layer 44, the electroplate-initializing layer 43 and the adhesion layer 42 which are not protected by the magnetic-inductive material 45 are removed by the etching method. In addition, the second photoresist layer 46 is also removed, and the result is shown in FIG. 4(H). Then, the substrate 40 which is not protected by the passivation layer 41 is etched, and the result is shown in FIG. 4(I). At this moment, the etching of the substrate 40 is processed by the dry etching method in this embodiment. Finally, the passivation layer 41 is removed, and the result is shown in FIG. 4(J). The passivation layer 41 is removed by the wet etching method in this embodiment. In addition, the suspended structures appeared in FIG. 4(I) and FIG. 4(J) are not the true suspension. Because FIG. 4(I) and FIG. 4(J) are the diagrams of the cross-sectioned manufacturing process drawn along the A-A' section line, all the structures look like suspending when some parts are etched. In fact, the structures shown in FIG. 4(I) and FIG. 4(J) are not suspended. In addition, although the titanium is the adhesion layer 42, the gold is the electroplate-initializing layer 43, and the nickel is the magnetic-inductive material in this embodiment, the materials can still be chosen in demand in practice. That is to say, other materials are also adequate for the adhesion layer, the electroplate-initializing layer and the magnetic-inductive layer in the present invention. For instance, other metals (i.e. nickel cobalt alloy and nickel iron alloy) are substituted for the nickel layer as the magnetic-inductive layer.

Figure 5:
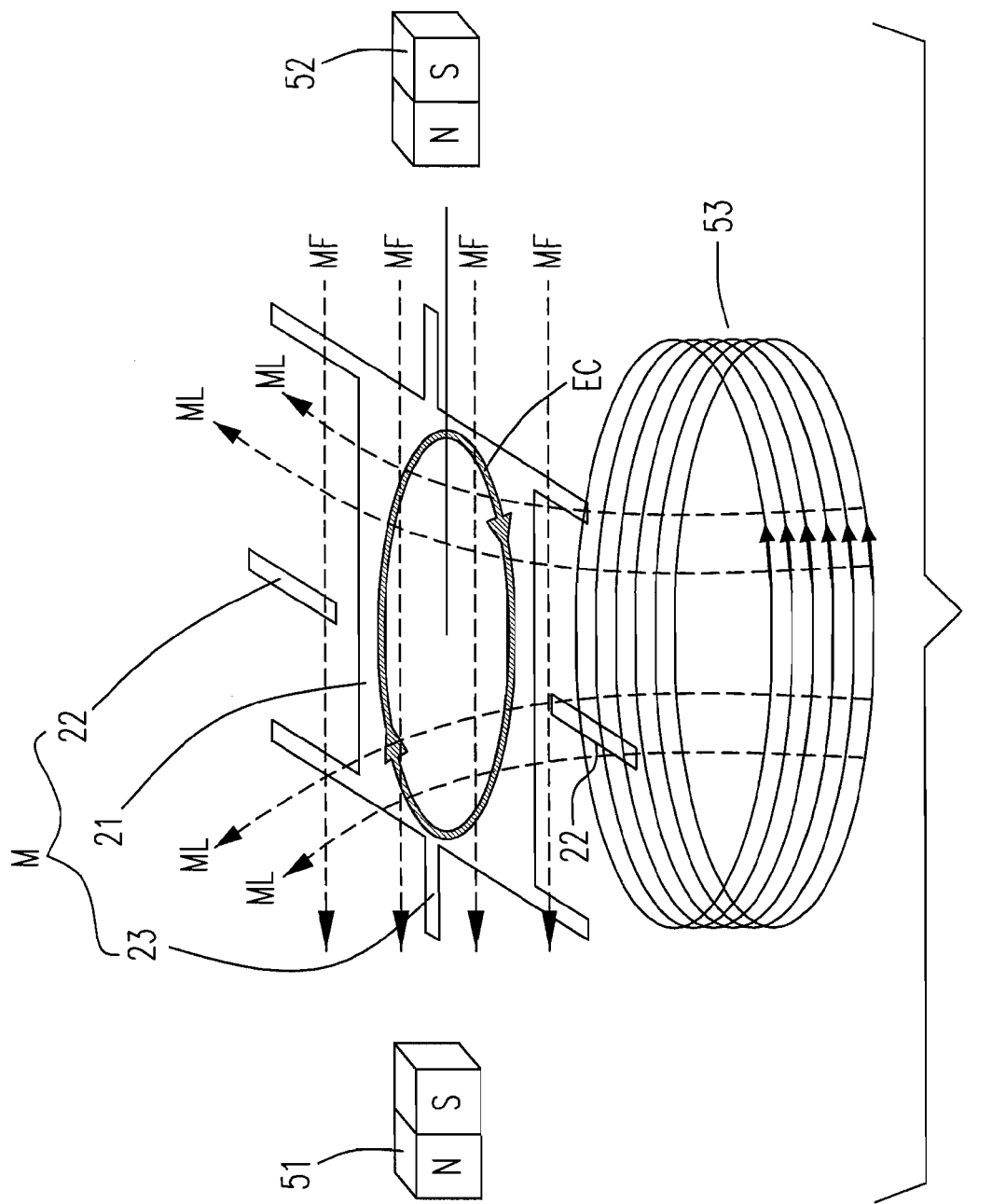
FIG. 5 is a diagram showing the driving method of the magnetic element in accordance with the preferred embodiment of the present invention.

Please refer to FIG. 2 and FIG. 5, wherein FIG. 5 is the diagram showing the driving method of the magnetic element in accordance with the preferred embodiment of the present invention. In FIG. 5, for the convenience of the description, only the actuation part 21, the first torsion bar 22, the second torsion bar 23, the first magnetic device 51, the second magnetic device 52, and the magnetic field generation device 53 of the magnetic element M are drawn out. As shown in FIG. 5, when the magnetic line of force ML emitted from the magnetic field generation device 53 is changed, Eddy current (EC) is generated on the actuation part 21. Because the magnetic force MF exists between the first magnetic device 51 and the second magnetic device 52, and Eddy current (EC) appears, Lorentz force appears on the actuation part 21, and the actuation part 21 is twisted according to the first torsion bar 22 or the second torsion bar 23 as the axis. In addition, the configuration angle between the first torsion bar 22 and the second torsion bar 23 can be adjusted in demand, and is not necessarily identical with the configuration angle in FIG. 5.

According to the above contents, it is clear that the elements actuated by the action-at-a-distance force are completely achieved in the present invention. In addition, because Eddy current belongs to the surface current and is distributed all over the micro-scanning mirror, Lorentz force is generated everywhere on the micro-scanning mirror. In addition, because the intensity of inductive electromotive force is proportional to the inductive area, the potential energy is more stronger for being more farther from the center of the mirror. The generated Eddy current and the generated Lorentz force are therefore more stronger. In the viewpoint of mechanics, the generated torque is more larger for being farther from the center. In the viewpoint of production, because Eddy current is generated inductively, it does not need to produce the conductor coil thoroughly. Since the recirculation-closed Eddy current flows through the micro-scanning mirror by itself, the mechanic structure is the only one needed to be produced, and the electronic and magnetic signals are all inductively generated. This present invention is efficient in decreasing the high cost for the production of the conductor line of the prior art. In addition, as a result of the direct flow of the current, Joule heat was generated in the micro-scanning mirror driven by Lorentz force in the past. Heat generation makes the structure of the micro-scanning mirror deform, and even affects the dynamic behavior thereof. Since the current which is not enforced directly on the mirror is generated by the induction in the present invention, the power of the alternating magnetic field of the micro-scanning mirror is therefore relatively small, and the generation of Joule heat will be decreased relatively.

In summary, besides a driving method of the micro-scanning mirror, which is actuated by the single driving source in practice simultaneous with the completely contactless method, is provided in the present invention, a magnetic element having a reinforced structure is also provided. In addition, because the structure of the scanning mirror can be adjusted in demand, the application range is effectively increased. In addition, because the magnetic element and the manufacturing method of the preferred embodiment of the present invention have not been described in the prior art, and the magnetic element and the manufacturing method therefor of the preferred embodiment of the present invention have advantages, i.e. low cost, large vibrating range, and light weight, etc., the present invention indeed has novelty, non-obviousness, and industrial utility. Furthermore, although the micro-scanning mirror is the preferred embodiment in the specification of the present invention, the manufacturing method of the present invention is not limited in the micro-electromechanical system field and is also applied in the other categories.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for manufacturing a magnetic element having an actuation part and a reinforcing structure, comprising steps of:

(a) providing a substrate having a first surface and a second surface;
(b) forming a passivation layer having a first specific area and a second specific area on the first surface;
(c) forming an electroplate-initializing layer on the second surface;
(d) forming a first photoresist layer having a third specific area on the electroplate-initializing layer;
(e) forming a layer of a magnetic-inductive material on the third specific area, wherein the magnetic-inductive material is selected from a group consisting of a nickel, a nickel cobalt alloy and a nickel iron alloy;
(f) forming a second photoresist layer on the second specific area of the first surface of the substrate and on the passivation layer;
(g) removing a part of the substrate on the first specific area and the second photoresist layer to form a pattern for the magnetic element on the first surface and then removing the first photoresist layer and a part of the electroplate-initializing layer to form the actuation part having the formed layer of the magnetic-inductive material and a portion of the electroplate-initializing layer on the second surface;
(h) etching the substrate to present the reinforcing structure for the magnetic element; and
(i) removing the passivation layer to form the magnetic element.

2. The method according to claim 1, wherein the step (c) further comprising steps of:
(c1) forming an adhesion layer on the second surface; and
(c2) forming the electroplate-initializing layer on the adhesion layer.

3. The method according to claim 1, wherein the step (c) is processed by a deposition method.

4. The method according to claim 1, wherein the step (e) is processed by an electroforming method.

5. The method according to claim 1, wherein the step (g) is processed by an etching method.

* * * * *